US011296710B2

(12) United States Patent
Roodnat (10) Patent No.: US 11,296,710 B2
(45) Date of Patent: Apr. 5, 2022

(54) DIGITAL SUBSAMPLING PLL WITH DTC-BASED SAR PHASE ESTIMATION

(71) Applicant: Qorvo US, Inc., Greensboro, NC (US)

(72) Inventor: Anton Willem Roodnat, Enspijk (NL)

(73) Assignee: QORVO US, INC., Greensboro, NC (US)

( * ) Notice: Subject to any disclaimer, the term of this patent is extended or adjusted under 35 U.S.C. 154(b) by 0 days.

(21) Appl. No.: 17/000,647

(22) Filed: Aug. 24, 2020

(65) Prior Publication Data

US 2022/0060191 A1 Feb. 24, 2022

(51) Int. Cl.
| | |
|---|---|
| H03L 7/093 | (2006.01) |
| H03L 7/099 | (2006.01) |
| H03L 7/081 | (2006.01) |
| H03L 7/091 | (2006.01) |

(52) U.S. Cl.
CPC ............. *H03L 7/093* (2013.01); *H03L 7/081* (2013.01); *H03L 7/091* (2013.01); *H03L 7/0991* (2013.01)

(58) Field of Classification Search
CPC ......... H03L 7/093; H03L 7/081; H03L 7/091; H03L 7/0991
See application file for complete search history.

(56) References Cited

U.S. PATENT DOCUMENTS

| | | | | | |
|---|---|---|---|---|---|
| 5,355,098 | A | * | 10/1994 | Iwasaki | H03L 7/104 |
| | | | | | 331/14 |
| 5,369,670 | A | * | 11/1994 | Zagloul | G06F 17/141 |
| | | | | | 370/210 |
| 5,377,248 | A | * | 12/1994 | Brooks | H03M 1/462 |
| | | | | | 377/70 |
| 5,502,711 | A | * | 3/1996 | Clark | G11B 20/1423 |
| | | | | | 360/51 |
| 6,097,244 | A | * | 8/2000 | Chen | H03H 11/04 |
| | | | | | 327/308 |

(Continued)

FOREIGN PATENT DOCUMENTS

CN 110708061 A * 1/2020

OTHER PUBLICATIONS

Chang et al, A_5_GHz_Fractional-N_DTC-Based_Digital_Phase-Locked_Loops_With_243.8_dB_FOM, IEEE 2016 (Year: 2016).*

(Continued)

*Primary Examiner* — Berhanu Tadese
(74) *Attorney, Agent, or Firm* — Withrow & Terranova, P.L.L.C.

(57) ABSTRACT

The present disclosure relates to a digital subsampling phase-locked-loop (PLL) with a digital-to-time converter (DTC) based successive-approximation-register (SAR) phase estimation. This disclosed PLL utilizes a DTC and a one-bit sampler to generate one phase word by calculating multiple one-bit phase measurements with a SAR algorithm. The one phase word, which indicates the phase estimation of a radio frequency (RF) output signal compared to a reference signal, enables the PLL to lock the RF output signal with the reference signal in a short settling time. In addition, utilizing the one-bit sampler instead of a conventional frequency divider is good for linearity and low power consumption of the PLL without introducing significant noise in the RF output signal.

19 Claims, 4 Drawing Sheets

(56) References Cited

U.S. PATENT DOCUMENTS

| | | | | |
|---|---|---|---|---|
| 6,654,432 | B1* | 11/2003 | O'Shea | H04L 7/042 |
| | | | | 375/354 |
| 6,833,767 | B1* | 12/2004 | Huff | H03C 3/0925 |
| | | | | 331/17 |
| 9,455,667 | B2* | 9/2016 | Vlachogiannakis | |
| | | | | H03B 5/1215 |
| 9,531,394 | B1* | 12/2016 | Caffee | G06F 1/022 |
| 10,224,942 | B2* | 3/2019 | Jakobsson | H03L 7/091 |
| 10,291,214 | B2* | 5/2019 | Thijssen | H03K 5/1252 |
| 10,581,418 | B2* | 3/2020 | Wu | H03L 7/093 |
| 10,615,807 | B2* | 4/2020 | Jakobsson | H03L 7/087 |
| 10,862,496 | B1* | 12/2020 | Neto | H03M 1/462 |
| 10,895,850 | B1* | 1/2021 | Elkholy | H03M 3/368 |
| 10,917,078 | B2* | 2/2021 | Wu | H03L 7/1976 |
| 10,996,634 | B2* | 5/2021 | Yao | H03L 7/1976 |
| 2006/0125534 | A1* | 6/2006 | Park | H03L 7/10 |
| | | | | 327/141 |
| 2006/0132208 | A1* | 6/2006 | Park | H03L 7/0891 |
| | | | | 327/182 |
| 2014/0232473 | A1* | 8/2014 | Matsuda | H03L 7/091 |
| | | | | 331/8 |
| 2015/0153319 | A1* | 6/2015 | Shapiro | G01R 33/1284 |
| | | | | 324/207.11 |
| 2016/0226656 | A1* | 8/2016 | Okada | H03L 7/22 |
| 2016/0373120 | A1* | 12/2016 | Caffee | H03L 7/183 |
| 2017/0019087 | A1* | 1/2017 | Nicollini | H03H 11/18 |
| 2017/0324416 | A1* | 11/2017 | Jakobsson | H03L 7/0898 |
| 2017/0346493 | A1* | 11/2017 | Markulic | H03L 7/197 |
| 2018/0013455 | A1* | 1/2018 | Markulic | H03C 3/0966 |
| 2018/0337683 | A1* | 11/2018 | Mateman | H03L 7/091 |
| 2019/0036536 | A1* | 1/2019 | Siriburanon | H03L 7/18 |
| 2019/0158101 | A1* | 5/2019 | Jakobsson | H03L 7/0898 |
| 2019/0212703 | A1* | 7/2019 | Yao | H03L 7/0891 |
| 2019/0214976 | A1* | 7/2019 | Wu | H03K 5/1565 |
| 2020/0177173 | A1* | 6/2020 | Wu | H04L 25/4902 |
| 2020/0348626 | A1* | 11/2020 | Yao | H03L 7/0991 |
| 2021/0026309 | A1* | 1/2021 | Elkholy | G04F 10/005 |

OTHER PUBLICATIONS

Du et al, A Reference-Waveform Oversampling Technique in a Fractional-N ADPLL, IEEE Aug. 2021 (Year: 2021).*

Guide to Understanding Successive Approximation Registers (SAR) and Flash ADCs by Maxim Integrated, 2021, (Internet Citation https://www.maximintegrated.com/en/design/technical-documents/tutorials/1/1080.html) (Year: 2021).*

Liu et al, A 5-GHz Low-Power Low-Noise Integer-N Digital Subsampling PLL With SAR ADC PD, IEEE, Sep. 2018,. (Year: 2018).*

Markulic et al. Digital Subsampling Phase Lock Techniques for Frequency Synthesis and Polar Transmission, Analog Circuits and Signal Processing, 2019 (Year: 2019).*

Chillara, Vamshi Krishna et al., "An 860µW 2.1-to-2.7GHz All-Digital PLL-Based Frequency Modulator with a DTC-Assisted Snapshot TDC for WPAN (Bluetooth Smart and ZigBee) Applications," ISSCC 2014 / Session 9 / Low-Power Wireless / 9.8,2014 IEEE International Solid-State Circuits Conference, 3 pages.

Liu, Maliang et al., "A 5-GHz Low-Power Low-Noise Integer-N DigitalSubsampling PLL With SAR ADC PD," IEEE Transactions on Microwave Theory and Techniques, vol. 66, No. 9, Sep. 2018, pp. 4078-4087.

* cited by examiner

DIGITAL SUBSAMPLING PLL WITH DTC-BASED SAR PHASE ESTIMATION

FIELD OF THE DISCLOSURE

The present disclosure relates to a phase-locked-loop (PLL), and more particularly to a digital subsampling PLL with digital-to-time converter (DTC) based successive-approximation-register (SAR) phase estimation.

BACKGROUND

Phase-locked loop (PLL) based frequency synthesizers are widely utilized in radio frequency (RF) communication devices, such as an RF transmitter. A conventional PLL based frequency synthesizer normally includes a phase-frequency detector (PFD), a loop filter, a local oscillator (LO), and a frequency divider. An output signal provided by the LO is fed through the frequency divider back to the PFD to be compared to a reference signal. Once the output signal of the LO is locked with the reference signal in phase and frequency, the frequency synthesizer is settled. However, adjusting the phase of the divided RF signal so as to be aligned to the phase of the reference signal may result in a long settling time.

In addition, the frequency of the output signal of the LO is at a GHz-level, thus the frequency divider, which is used to reduce the frequency of the output signal of the LO in the feedback loop, requires a GHz-level clock. If the frequency of the reference signal is much lower than the frequency of the output signal of the LO, the frequency divider will be a high-power consumption component.

Accordingly, there remains a need for an improved frequency synthesizer design, which is able to reduce the settling time and the power consumption of the final product without introducing significant noise in the output signal.

SUMMARY

The present disclosure relates to a digital subsampling phase-locked-loop (PLL) with a digital-to-time converter (DTC) based successive-approximation-register (SAR) phase estimation. The disclosed PLL includes a local oscillator (LO), a phase sampling unit, and a successive-approximation-register (SAR) phase estimator. The phase sampling unit is configured to receive a radio frequency (RF) output signal generated by the LO and a reference signal, and configured to generate a sub-sampled output by sub-sampling the RF output signal with a sampling clock. Herein, the sampling clock has a same frequency as the reference signal and is offset by a time delay from the reference signal.

The time delay of the sampling clock offset from the reference signal is updated in each clock-cycle of the reference signal. The SAR phase estimator is configured to generate a phase word every N clock-cycles of the reference signal. N is an integer number. The phase word is derived from the sub-sampled output generated in each clock-cycle of the every N clock-cycles of the reference signal, and indicates a phase shift of the RF output signal compared to the reference signal. The LO is then configured to update the RF output signal based on the phase word.

In one embodiment of the PLL, N is greater than 4.

In one embodiment of the PLL, the phase sampling unit includes a digital to time convertor (DTC) controller, a DTC, and a sampler. The DTC controller is configured to provide a DTC total control to the DTC. The DTC total control is updated in each clock-cycle of the reference signal. In at least some clock-cycles of the every N clock-cycles of the reference signal, the DTC total control is updated based on the sub-sampled output generated in a corresponding previous clock-cycle of the reference signal. The DTC is configured to receive the reference signal and the DTC total control, and configured to provide the sampling clock. The DTC total control determines the time delay of the sampling clock offset from the reference signal in each clock-cycle of the reference signal. The sampler is configured to sub-sample the RF output signal with the sampling clock so as to provide the sub-sampled output in each clock-cycle of the reference signal.

In one embodiment of the PLL, the DTC total control is updated non-linearly in the at least some clock-cycles of the every N clock-cycles of the reference signal. Herein, each non-linear update of the DTC total control leads to an increment or a decrement in the time delay of the sampling clock offset from the reference signal for each clock-cycle of the reference signal.

In one embodiment of the PLL, the DTC total control is updated linearly and is not based on any sub-sampled output in some other clock-cycles of the every N clock-cycles of the reference signal.

In one embodiment of the PLL, the sampler is a one-bit sampler.

In one embodiment of the PLL, the DTC total control includes a DTC mixing control and a DTC SAR control, such that the time delay of the sampling clock offset from the reference signal in each clock-cycle of the reference signal is determined by the DTC mixing control and the DTC SAR control. Herein, the DTC mixing control signal is updated not based on the sub-sampled output. In the at least some clock-cycles of the every N clock-cycles of the reference signal, the DTC SAR control is updated based on the sub-sampled output generated in the corresponding previous clock-cycle of the reference signal.

In one embodiment of the PLL, the DTC SAR control is updated linearly with an equal increment in each clock-cycle of first M clock-cycles of the every N clock-cycles of the reference signal. The equal increment in the DTC SAR control leads to an equal increment in the time delay of the sampling clock offset from the reference signal in each clock-cycle of the first M clock-cycles of the reference signal. M is an integer and smaller than N. In addition, the DTC SAR control is updated non-linearly in each clock-cycle of remaining clock-cycles of the every N clock-cycles of the reference signal. Each non-linear update of the DTC SAR control is based on the sub-sampled output generated in the corresponding previous clock-cycle of the reference signal. Each non-linear update of the DTC SAR control leads to an increment or a decrement in the time delay of the sampling clock offset from the reference signal for each clock-cycle of the remaining clock-cycles of the reference signal.

In one embodiment of the PLL, the DTC mixing control is updated linearly with an equal increment in each clock-cycle of the every N clock-cycles of the reference signal. The equal increment in the DTC mixing control leads to an equal increment in the time delay of the sampling clock offset from the reference signal for each clock-cycle of the every N clock-cycles of the reference signal. Herein, the equal increment in the DTC SAR control and the equal increment in the DTC mixing control are different.

In one embodiment of the PLL, the DTC total control includes a DTC mixing control and a DTC SAR control, such that the time delay of the sampling clock offset from the reference signal in each clock-cycle of the reference signal is determined by the DTC mixing control and the DTC SAR control. Herein, the DTC mixing control signal keeps unchanged in each clock-cycle of the every N clock-cycles of the reference signal. In the at least some clock-cycles of the every N clock-cycles of the reference signal, the DTC SAR control is updated based on the sub-sampled output generated in the corresponding previous clock-cycle of the reference signal.

In one embodiment of the PLL, N is 8. In first 4 clock-cycles of the every 8 clock-cycles of the reference signal, the DTC total control is updated linearly with an equal increment in each clock-cycle of the first 4 clock-cycles of the reference signal. The equal increment in the DTC total control leads to an equal increment in the time delay of the sampling clock offset from the reference signal in each clock-cycle of the first 4 clock-cycles of the reference signal. In remaining 4 clock-cycles of the every 8 clock-cycles of the reference signal, the DTC total control is updated non-linearly in each clock-cycle of the remaining 4 clock-cycles of the reference signal. Herein, each non-linear update of the DTC total control is based on the sub-sampled output generated in the corresponding previous clock-cycle of the reference signal. Each non-linear update of the DTC total control leads to an increment or a decrement in the time delay of the sampling clock offset from the reference signal for each clock-cycle of the remaining 4 clock-cycles of the reference signal.

In one embodiment of the PLL, a duty cycle of the RF output signal is between 25% and 75%.

In one embodiment of the PLL, the LO is a digitally controlled oscillator (DCO).

According to one embodiment, the PLL further includes a loop filter between the SAR phase estimator and the LO. The loop filter is configured to provide a digital control signal to the LO based on the phase word.

In one embodiment of the PLL, the loop filter is a low-pass filter.

According to one embodiment, the PLL further includes a differentiator and a proportional integral (PI) control unit. The differentiator is following the SAR phase estimator, and configured to differentiate the phase word into a frequency parameter. The PI control unit is between the differentiator and the loop filter, and configured to receive the frequency parameter from the differentiator and provide a difference output signal to the loop filter. The loop filter is configured to provide the digital control signal by filtering the difference output signal.

In one embodiment of the PLL, both the differentiator and the PI control unit operate at a frequency as 1/N of a frequency of the reference signal.

According to one embodiment, the PLL further includes a loop filter between the SAR phase estimator and the LO. The loop filter is configured to receive the phase word from the SAR phase estimator and to provide a digital control signal to the LO.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-4 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
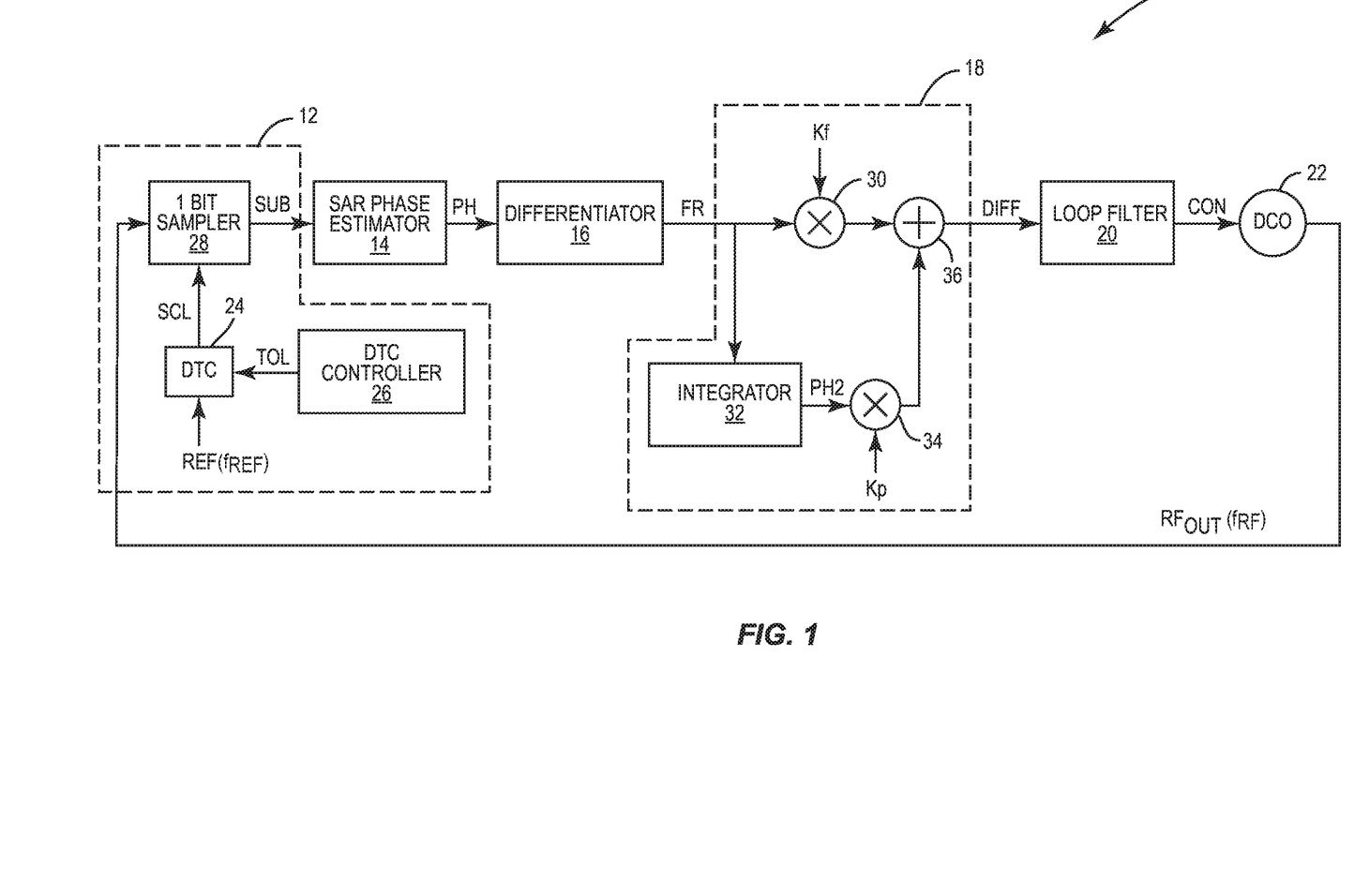
FIG. 1 shows an exemplary phase-locked-loop (PLL) according to one embodiment of the present disclosure.

The present disclosure relates to a digital subsampling phase-locked-loop (PLL) with a digital-to-time converter (DTC) based successive-approximation-register (SAR) phase estimation. FIG. 1 shows an exemplary PLL 10 according to one embodiment of the present disclosure. The PLL 10 is configured to receive a reference signal REF with a reference frequency $f_{REF}$, and to provide a radio frequency (RF) output signal $RF_{OUT}$ with an RF output frequency $f_{RF}$. Herein, the reference frequency $f_{REF}$ is constant and associated with a desired output frequency of the RF output signal $RF_{OUT}$. The PLL 10 includes a feedback loop with the following components: a phase sampling unit 12, a SAR phase estimator 14, a differentiator 16, a proportional integral (PI) control unit 18, a loop filter 20, and a digital-controlled oscillator (DCO) 22.

In detail, the RF output signal $RF_{OUT}$ is fed to the phase sampling unit 12 and is sub-sampled by the phase sampling unit 12 to generate a sub-sampled output SUB. The phase sampling unit 12 includes a DTC 24, a DTC controller 26, and a sampler 28. The DTC 24 is configured to receive the reference signal REF and a DTC total control TOL provided by the DTC controller 26, and configured to provide a sampling clock SCL to the sampler 28. Herein, the sampling clock SCL has a same frequency as the reference frequency $f_{REF}$, and is offset by a time delay from the reference signal REF (having a phase shift compared to the reference signal REF). The time delay (phase shift) between the sampling clock SCL and the reference signal REF is determined by the DTC total control TOL.

The sampler 28 is configured to receive the RF output signal $RF_{OUT}$, and configured to sub-sample the RF output signal $RF_{OUT}$ with the sampling clock SCL to provide the sub-sampled output SUB. The sub-sampled output SUB being low (SUB=0) indicates the RF output signal $RF_{OUT}$ lags the sampling clock SCL, while the sub-sampled output SUB being high (SUB=1) indicates the RF output signal $RF_{OUT}$ leads/aligns the sampling clock SCL. Once the PLL 10 is locked, the sampling clock SCL and the RF output signal $RF_{OUT}$ are aligned in phase, and therefore the RF output signal $RF_{OUT}$ will have a fixed phase shift from the reference signal REF (more details are described in the following paragraphs related to FIG. 2). In one embodiment, the sampler 28 is a one-bit sampler.

The SAR phase estimator 14 is configured to generate a phase word PH based on the sub-sampled output SUB (more details are described in the following paragraphs related to FIG. 2). The phase word PH represents a phase shift of the RF output signal $RF_{OUT}$ compared to the reference signal REF. The differentiator 16 is followed by the SAR phase estimator 14, and configured to differentiate the phase word PH into a frequency parameter FR.

The PI control unit 18, between the differentiator 16 and the loop filter 20, is configured to receive the frequency parameter FR from the differentiator 16 and to provide a difference output signal DIFF to the loop filter 20. The PI control unit 18 includes one proportional path with a first multiplier 30 and an integral path with an integrator 32 and a second multiplier 34. The first multiplier 30 is configured to multiply the frequency parameter FR with a first predetermined value Kf to obtain a first multiplied signal. The integrator 32 is configured to perform an integration function on the frequency parameter FR and to provide an integrated signal, and the second multiplier 34 is configured to multiply the integrated signal with a second predetermined value Kp to obtain a second multiplied signal. The PI control unit 18 further includes a signal combination block 36, which is configured to combine the first multiplied signal and the second multiplied signal to obtain the difference output signal DIFF. Herein, the signal combination block 36 is an adder. However, depending on the characteristics of the other electronic elements of the PI control unit 18, the signal combination block 36 could be a subtractor.

The loop filter 20 may include electronic components such as resistors and capacitors, and is configured to smooth the difference output signal DIFF and provide a digital control signal CON to the DCO 22. The loop filter 20 may be a low-pass filter. In one embodiment, the loop filter 20 may be a 2nd order low-pass filter with an out-of-band attenuation with a roll-off of 12 dB per octave. In some applications, the differentiator 16 and the PI control unit 18 might be omitted between the SAR phase estimator 14 and the loop filter 20. As such, the loop filter 20 may be directly coupled to the SAR phase estimator 14, and configured to smooth the phase word PH to provide the digital control signal CON.

The DCO 22 is configured to receive the digital control signal CON to update the RF output signal $RF_{OUT}$ with an updated phase/frequency. Such updated phase/frequency is a function of the digital control signal CON. The updated RF output signal $RF_{OUT}$ is then applied to the phase sampling unit 12 to update the sub-sampled output SUB. The updated sub-sampled output SUB is applied to the SAR phase estimator 14 to update the phase word PH, which determines a new value of the digital control signal CON.

Figure 2:
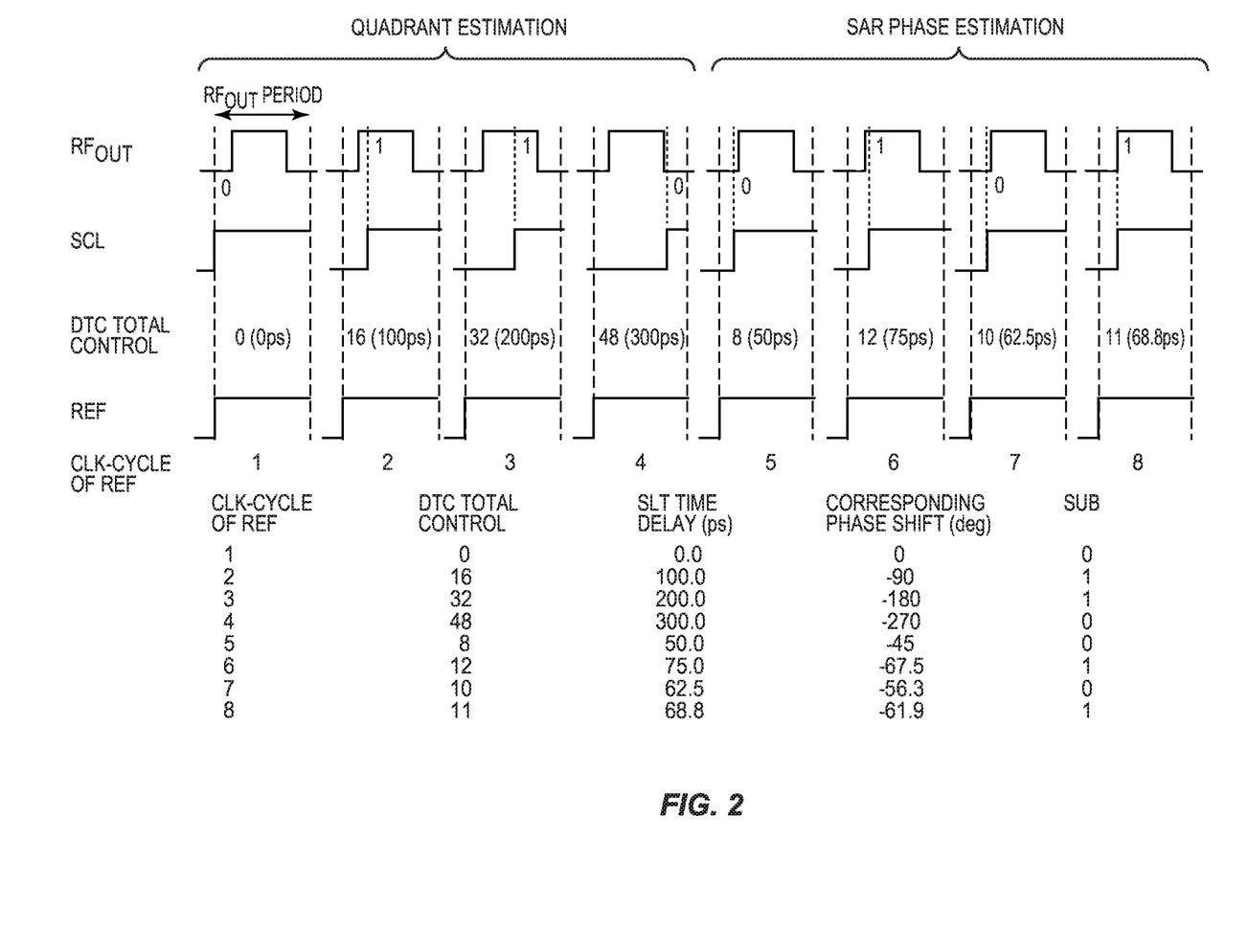
FIG. 2 illustrates one estimation process of a phase sampling unit in the PLL shown in the FIG. 1.

FIG. 2 illustrates an exemplary estimation process of the phase sampling unit 12 when the desired output frequency of the RF output signal $RF_{OUT}$ is an integer multiple of the reference frequency $f_{REF}$ of the reference signal REF. For instance, the desired output frequency of the RF output signal $RF_{OUT}$ is 2496 MHz and the reference frequency $f_{REF}$ is 32 MHz. The RF output signal $RF_{OUT}$ has a desired clock-cycle $T_{RF}$=1/2496 MHz≈400 ps, and each 100 ps in one clock cycle of the RF output signal $RF_{OUT}$ corresponds to a −90 degree shift in phase.

Each estimation process of the phase sampling unit 12 takes N clock-cycles, e.g. N=8, of the reference signal REF, and includes two estimation steps, quadrant estimation (first several clock-cycles of every N clock-cycles, e.g. first four clock-cycles of every eight clock-cycles) and SAR phase estimation (last several clock-cycles of every N clock-cycles, e.g. last four clock-cycles of the every eight clock-cycles). The quadrant estimation estimates which quadrant the phase of the RF output signal $RF_{OUT}$ lies, while the SAR phase estimation iteratively estimates the phase of the RF output signal $RF_{OUT}$ for increasing accuracy. In different applications, N may be a different integer number and greater than 4. The quadrant estimation and the SAR phase estimation each may take fewer or more clock-cycles.

In a first clock-cycle of the reference signal REF, the DTC total control TOL provided by the DTC controller 26 is 0, which leads to a 0 ps time delay. The DTC 24 is configured to receive the DTC total control TOL, and to provide the sampling clock SCL, which has the 0 ps time delay offset from the reference signal REF. Herein, the sampler 28 is configured to sub-sample the RF output signal $RF_{OUT}$ with the 0 ps-time-delay sampling clock SCL. If the RF output signal $RF_{OUT}$ aligns to the 0 ps-time-delay sampling clock SCL, the RF output signal $RF_{OUT}$ with the 0 ps-time-delay has a 0 degree phase shift from the reference signal REF. In the first clock-cycle of the reference signal REF, the sub-sampled output SUB, which is based on the 0 ps-time-delay sampling clock SCL and provided by the sampler 28, is equal to 0.

In a second clock-cycle of the reference signal REF, the DTC total control TOL provided by the DTC controller 26 is 16, which leads to a 100 ps time delay. The DTC 24 is configured to receive the DTC total control TOL, and to provide the sampling clock SCL, which has the 100 ps time delay offset from the reference signal REF. Herein, the sampler 28 is configured to sub-sample the RF output signal $RF_{OUT}$ with the 100 ps-time-delay sampling clock SCL. If the RF output signal $RF_{OUT}$ aligns to the 100 ps-time-delay sampling clock SCL, the RF output signal $RF_{OUT}$ with the 100 ps-time-delay has a −90 degree phase shift from the reference signal REF. In the second clock-cycle of the reference signal REF, the sub-sampled output SUB, which is based on the 100 ps-time-delay sampling clock SCL and provided by the sampler 28, is equal to 1.

In a third clock-cycle of the reference signal REF, the DTC total control TOL provided by the DTC controller 26 is 32, which leads to a 200 ps time delay. The DTC 24 is configured to receive the DTC total control TOL, and to provide the sampling clock SCL, which has the 200 ps time delay offset from the reference signal REF. Herein, the sampler 28 is configured to sub-sample the RF output signal $RF_{OUT}$ with the 200 ps-time-delay sampling clock SCL. If the RF output signal $RF_{OUT}$ aligns to the 200 ps-time-delay sampling clock SCL, the RF output signal $RF_{OUT}$ with the 200 ps-time-delay has a −180 degree phase shift from the reference signal REF. In the third clock-cycle of the reference signal REF, the sub-sampled output SUB, which is based on the 200 ps-time-delay sampling clock SCL and provided by the sampler 28, is equal to 1.

In a fourth clock-cycle of the reference signal REF, the DTC total control TOL provided by the DTC controller 26 is 48, which leads to a 300 ps time delay. The DTC 24 is configured to receive the DTC total control TOL, and to provide the sampling clock SCL, which has the 300 ps time delay offset from the reference signal REF. Herein, the sampler 28 is configured to sub-sample the RF output signal $RF_{OUT}$ with the 300 ps-time-delay sampling clock SCL. If the RF output signal $RF_{OUT}$ aligns to the 300 ps-time-delay sampling clock SCL, the RF output signal $RF_{OUT}$ with the 300 ps-time-delay has a −270 degree phase shift from the reference signal REF. In the fourth clock-cycle of the reference signal REF, the sub-sampled output SUB, which is based on the 300 ps-time-delay sampling clock SCL and provided by the sampler 28, is equal to 0.

It is noted that the DTC total control TOL and the time delay of the sampling clock (offset from the reference signal) have a monotonic relationship, and both are updated in each clock-cycle of the reference signal REF. In the first four clock-cycles of the reference signal REF, the DTC total control TOL changes linearly with an equal increment for each clock-cycle of the reference signal REF. Such equal increment in the DTC total control TOL leads to an equal increment in the time delay of the sampling clock (offset from the reference signal REF) for each clock-cycle of the reference signal REF.

In the first four clock-cycles of the reference signal REF, the DTC total control TOL is designed such that the time delays of the sampling clock (offset from the reference signal) for the first, second, third, and fourth clock-cycles of the reference signal REF are equally spread-out in one clock-cycle of the RF output signal $RF_{OUT}$ (0 ps, 100 ps, 200 ps, 300 ps for one 400 ps clock-cycle of the RF output signal $RF_{OUT}$). Consequently, the sampler 28 is enabled to sub-sample the RF output signal $RF_{OUT}$ at each quarter of one clock-cycle of the RF output signal $RF_{OUT}$. In this example, the sub-sampled outputs SUB provided by the sampler 28 for the first, second, third, and fourth clock-cycles of the reference signal REF are 0, 1, 1, and 0, respectively, which indicates that the phase of the RF output signal $RF_{OUT}$ lies in the first quadrant. The quadrant estimation is necessary for the RF output signal $RF_{OUT}$ without a 50% duty cycle waveform. With this quadrant estimation, the RF output signal $RF_{OUT}$ may have a duty cycle between 25% and 75%.

Once the phase of the RF output signal $RF_{OUT}$ is detected in the first quadrant, the SAR phase estimation starts to adjust the time delay of the sampling clock SCL, such that the RF output signal $RF_{OUT}$ will iteratively align to the sampling clock SCL in phase. Consequently, a phase shift between the RF output signal $RF_{OUT}$ and the reference signal REF can be estimated.

In a fifth clock-cycle of the reference signal REF, the DTC total control TOL is designed such that the time delay of the sampling clock SCL (offset from the reference signal REF) lies in the first quarter of one clock-cycle of the RF output signal $RF_{OUT}$ (which corresponds to the first quadrant in phase). In one example, the DTC controller 26 is configured to provide the DTC total control TOL=8, which leads to a 50 ps time delay. The DTC 24 is configured to receive the DTC total control TOL, and to provide the sampling clock SCL, which has the 50 ps time delay from the reference signal REF (in the first quarter <0 ps, 100 ps> of one clock-cycle of the RF output signal $RF_{OUT}$).

The sampler 28 is configured to sub-sample the RF output signal $RF_{OUT}$ with the 50 ps-time-delay sampling clock SCL and to provide the sub-sampled output SUB. If the RF output signal $RF_{OUT}$ aligns to the 50 ps-time-delay sampling clock SCL, the RF output signal $RF_{OUT}$ with the 50 ps-time-delay has a −45 degree phase shift from the reference signal REF. Herein, the sub-sampled output SUB based on the 50 ps-time-delay sampling clock SCL is equal to 0, which indicates that the sampling clock SCL leads the RF output signal $RF_{OUT}$ in phase. Further considering that the phase of the RF output signal $RF_{OUT}$ is in the first quadrant, the phase of the RF output signal $RF_{OUT}$ should be between −45 degrees and −90 degrees.

In a sixth clock-cycle of the reference signal REF, the DTC total control TOL is designed such that the time delay of the sampling clock SCL corresponds to a phase shift of the RF output signal $RF_{OUT}$ between −45 degrees and −90 degrees. In one example, the DTC controller 26 is configured to provide the DTC total control TOL=12, which leads to a 75 ps time delay. The DTC 24 is configured to receive the DTC total control TOL, and to provide the sampling clock SCL, which has the 75 ps time delay from the reference signal REF (corresponding to a −67.5 degree phase shift in the RF output signal $RF_{OUT}$ compared to the reference signal REF).

The sampler 28 is configured to sub-sample the RF output signal $RF_{OUT}$ with the 75 ps-time-delay sampling clock SCL and to provide the sub-sampled output SUB. If the RF output signal $RF_{OUT}$ aligns to the 75 ps-time-delay sampling clock SCL, the RF output signal $RF_{OUT}$ with the 75 ps-time-delay has a −67.5 degree phase shift from the reference signal REF. Herein, the sub-sampled output SUB based on the 75 ps-time-delay sampling clock SCL is equal to 1, which indicates that the RF output signal $RF_{OUT}$ leads (may align) the sampling clock SCL in phase. Further considering that the phase of the RF output signal $RF_{OUT}$ is between −45 degrees and −90 degrees, the phase of the RF output signal $RF_{OUT}$ should be between −45 degrees and −67.5 degrees.

In a seventh clock-cycle of the reference signal REF, the DTC total control TOL is designed such that the time delay of the sampling clock SCL corresponds to a phase shift of the RF output signal $RF_{OUT}$ between −45 degrees and −67.5 degrees. In one example, the DTC controller 26 is configured to provide the DTC total control TOL=10, which leads to a 62.5 ps time delay. The DTC 24 is configured to receive the DTC total control TOL, and to provide the sampling clock SCL, which has the 62.5 ps time delay from the reference signal REF (corresponding to a −56.3 degree phase shift in the RF output signal $RF_{OUT}$ compared to the reference signal REF).

The sampler 28 is configured to sub-sample the RF output signal $RF_{OUT}$ with the 62.5 ps-time-delay sampling clock SCL and to provide the sub-sampled output SUB. If the RF output signal $RF_{OUT}$ aligns to the 62.5 ps-time-delay sampling clock SCL, the RF output signal $RF_{OUT}$ with the 62.5 ps-time-delay has a −56.3 degree phase shift from the reference signal REF. Herein, the sub-sampled output SUB based on the 62.5 ps-time-delay sampling clock SCL is equal to 0, which indicates that the RF output signal $RF_{OUT}$ lags the sampling clock SCL in phase. Further considering that the phase of the RF output signal $RF_{OUT}$ is between −45 degrees and −67.5 degrees, the phase of the RF output signal $RF_{OUT}$ should be between −56.3 degrees and −67.5 degrees.

In an eighth clock-cycle of the reference signal REF, the DTC total control TOL is designed such that the time delay of the sampling clock SCL corresponds to a phase shift of the RF output signal $RF_{OUT}$ between −56.3 degrees and −67.5 degrees. In one example, the DTC controller 26 is configured to provide the DTC total control TOL=11, which leads to a 68.8 ps time delay. The DTC 24 is configured to receive the DTC total control TOL, and to provide the sampling clock SCL, which has the 68.8 ps time delay from the reference signal REF (corresponding to a −61.9 degree phase shift in the RF output signal $RF_{OUT}$ compared to the reference signal REF).

The sampler 28 is configured to sub-sample the RF output signal $RF_{OUT}$ with the 68.8 ps-time-delay sampling clock SCL and to provide the sub-sampled output SUB. If the RF output signal $RF_{OUT}$ aligns to the 68.8 ps-time-delay sampling clock SCL, the RF output signal $RF_{OUT}$ with the 68.8 ps-time-delay has a −61.9 degree phase shift from the reference signal REF. Herein, the sub-sampled output SUB based on the 75 ps-time-delay sampling clock SCL is equal to 1, which indicates that the RF output signal $RF_{OUT}$ leads (may align) the sampling clock SCL in phase. Further considering that the phase of the RF output signal $RF_{OUT}$ is between −56.3 degrees and −67.5 degrees, the phase of the RF output signal $RF_{OUT}$ should be between −56.3 degrees and −61.9 degrees.

After these eight clock-cycles of the reference signal REF, the SAR phase estimator 14 is configured to generate the phase word PH, which indicates the phase estimation of the RF output signal $RF_{OUT}$ compared to the reference signal REF (−61.9 degrees in this case). The phase word PH is generated based on the sub-sampled outputs SUB in the first through eighth clock-cycles of the reference signal REF. A different combination of the sub-sampled outputs SUB in the first through eighth clock-cycles of the reference signal REF will lead to a different phase word PH. The SAR phase estimator 14 is configured to generate one phase word PH every N (e.g. N=8 in this case) clock-cycles of the reference signal REF. The differentiator 16 and the PI control unit 18 operate based on the phase word PH, such that the differentiator 16 and the PI control unit 18 operate at a frequency as 1/N of the reference frequency $f_{REF}$.

Different from in the first 4 clock-cycles of the reference signal REF, in the last 4 clock-cycles of the reference signal REF, the DTC total control TOL changes non-linearly. The non-linear updates of the DTC total control TOL lead to increments or decrements in the time delay of the sampling clock (compared to the reference signal), and correspondingly lead to increments or decrements in the phase shift between the RF output signal $RF_{OUT}$ and the reference signal. In the first four clock-cycles of the reference signal REF, the DTC total control TOL is determined not to be related to the sub-sampled output SUB, while in the last four clock-cycles of the reference signal REF, the DTC total control TOL is determined based on the sub-sampled output SUB generated in the corresponding previous clock-cycle of the reference signal REF.

Figure 3A:
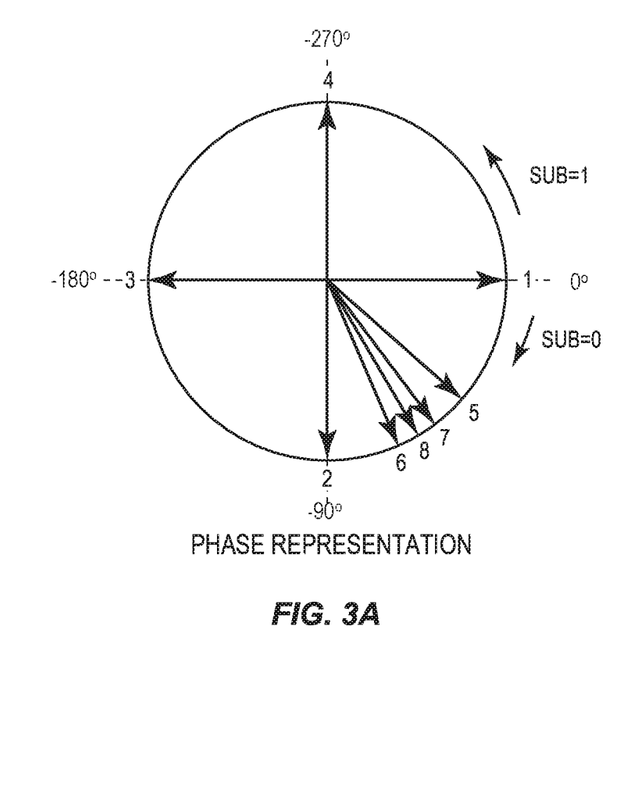
FIGS. 3A and 3B show phase shifts provided by a digital to time converter (DTC) during the estimation process illustrated in FIG. 2.
Figure 3B:
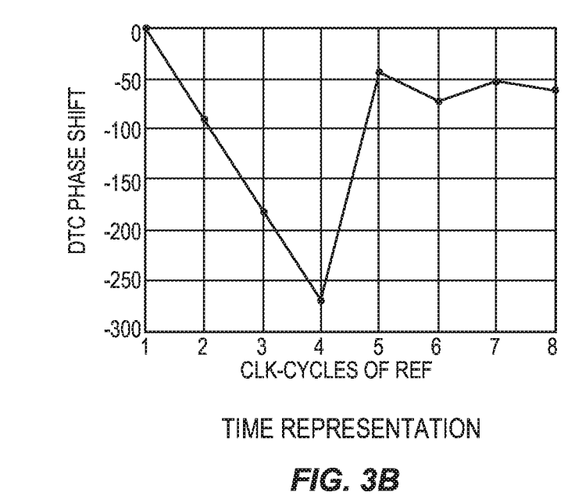

FIGS. 3A and 3B show phase shift estimation in the RF output signal $RF_{OUT}$ corresponding to the time delay provided by the DTC 24 during the estimation process illustrated in FIG. 2. In the first four clock-cycles of the reference signal REF, the DTC 24 is configured to provide four equally spaced time delays for the sampling clock SCL, which correspond to 0 degree, −90 degree, −180 degree, and −270 degree phase shift estimations in the RF output signal $RF_{OUT}$ compared to the reference signal REF, respectively.

Once the SAR phase estimator 14 determines that the phase of the RF output signal $RF_{OUT}$ lies in the first quadrant (between 0 degree and −90 degrees), the DTC 24 is configured to provide the time delay of the sampling clock SCL (compared to the reference signal REF) in the first quarter of one clock-cycle of the RF output signal $RF_{OUT}$ (corresponding to a phase shift in the first quadrant). In the fifth clock-cycle of the reference signal REF, the DTC 24 is configured to provide the time delay of the sampling clock SCL, which corresponds to a −45 degree phase shift estimation in the RF output signal $RF_{OUT}$ compared to the reference signal REF (within the first quadrant, between 0 degree and −90 degrees). Then the sub-sampled output SUB based on the current sampling clock SCL determines whether to increase or decrease the time delay of the next sampling clock SCL (SUB=0 increases the time delay, SUB=1, decreases the time delay). In the fifth clock-cycle of the reference signal REF, the sub-sampled output SUB=0, the time delay of the next sampling clock SCL will be increased compared to the time delay of the current sampling clock SCL. Correspondingly, the next phase shift estimation in the RF output signal $RF_{OUT}$ will be increased compared to the current phase shift estimation of −45 degrees.

In the sixth clock-cycle of the reference signal REF, the DTC 24 is configured to provide the time delay of the sampling clock SCL, which corresponds to a −67.5 degree phase shift estimation in the RF output signal $RF_{OUT}$ compared to the reference signal REF (between −45 degrees and −90 degrees). Since the current sub-sampled output SUB=1, the time delay of the next sampling clock SCL needs to be decreased compared to the time delay of the current sampling clock SCL. Correspondingly, the next phase shift estimation in the RF output signal $RF_{OUT}$ will be decreased compared to the current phase shift estimation of −67.5 degrees.

In the seventh clock-cycle of the reference signal REF, the DTC 24 is configured to provide the time delay of the sampling clock SCL, which corresponds to a −56.3 degree phase shift estimation in the RF output signal $RF_{OUT}$ compared to the reference signal REF (between −45 degrees and −67.5 degrees). Since the current sub-sampled output SUB=0, the time delay of the next sampling clock SCL needs to be increased compared to the time delay of the current sampling clock SCL. Correspondingly, the next phase shift estimation in the RF output signal $RF_{OUT}$ will be increased compared to the current phase shift estimation of −56.3 degrees.

In the eighth clock-cycle of the reference signal REF, the DTC 24 is configured to provide the time delay of the sampling clock SCL, which corresponds to a −61.9 degree phase shift estimation in the RF output signal $RF_{OUT}$ compared to the reference signal REF (between −56.3 degrees and −67.5 degrees). Then, the SAR phase estimator 14 is configured to generate the phase word PH, which indicates the phase estimation of the RF output signal $RF_{OUT}$ compared to the reference signal REF (−61.9 degrees in this case).

Figure 4:
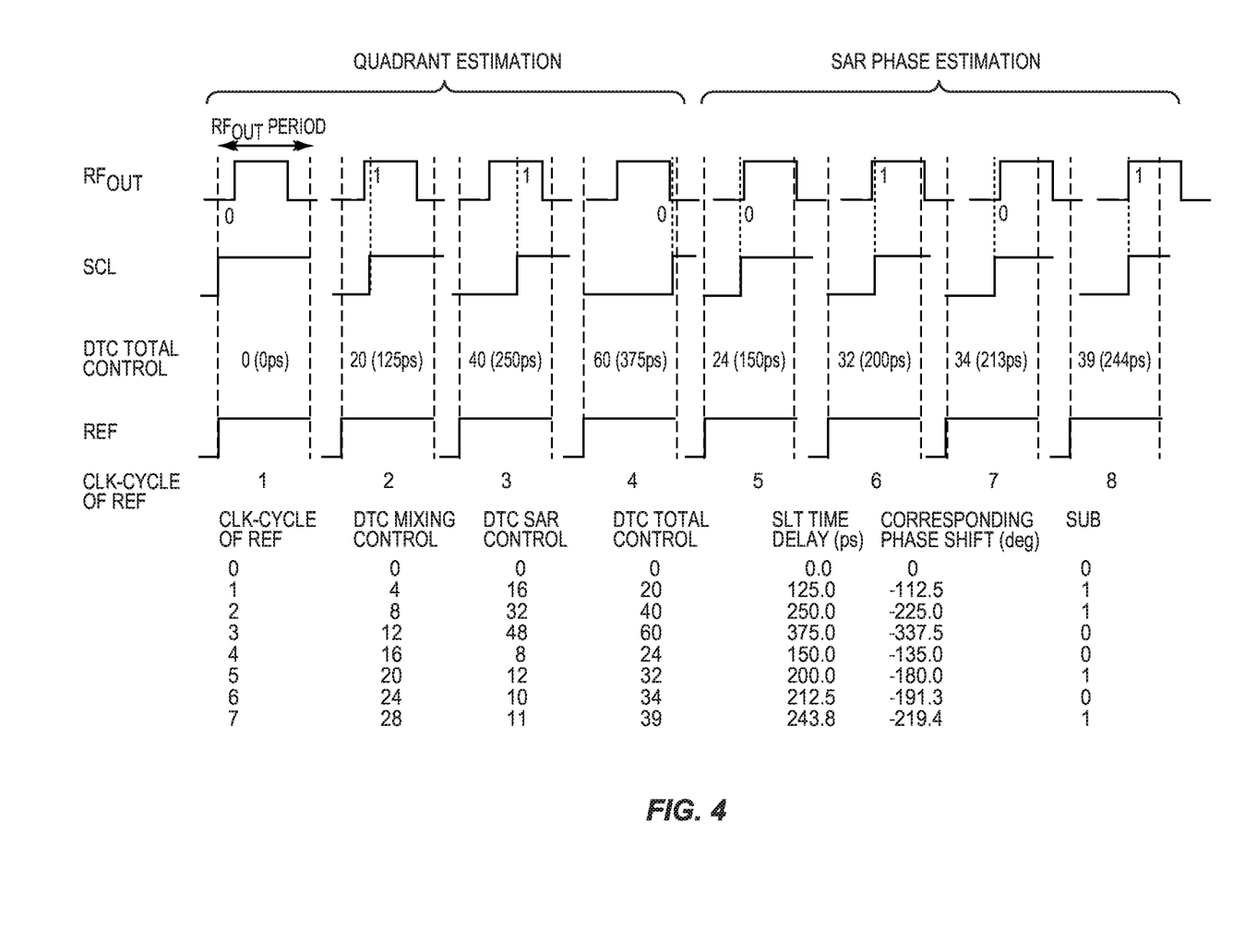
FIG. 4 illustrates an alternative estimation process of the phase sampling unit in the PLL shown in the FIG. 1

FIG. 4 illustrates an alternative estimation process of the phase sampling unit 12 when the desired output frequency of the RF output signal $RF_{OUT}$ is not an integer multiple of the reference frequency $f_{REF}$ of the reference signal REF. For instance, the desired output frequency of the RF output signal $RF_{OUT}$ is 2494 MHz and the reference frequency $f_{REF}$ is 32 MHz. The RF output signal $RF_{OUT}$ has a desired clock-cycle $T_{RF}$=1/2496 MHz≈400 ps, and each 100 ps in one clock cycle of the RF output signal $RF_{OUT}$ corresponds to a −90 degree shift in phase. Herein, the RF output signal $RF_{OUT}$ has an inherent time delay from the reference signal REF, which will increase 25 ps for every clock-cycle of the reference signal REF ([round (2494 MHz/32 MHz)*32 MHz-2494 MHz]/32 MHz*400 ps=25 ps). This inherent time delay of the RF output signal $RF_{OUT}$ corresponds to an inherent phase shift from the reference signal REF, and the inherent phase shift has a −22.5 degree increment for every clock-cycle of the reference signal REF (−[round (2494 MHz/32 MHz)*32 MHz-2494 MHz]/32 MHz*360 degrees=−22.5 degrees). As such, the DTC total control TOL is designed to take the inherent time delay/phase shift into account.

In one embodiment, the DTC total control TOL is a combination of a DTC mixing control MX and a DTC SAR control SR. Herein, the DTC mixing control MX is used to reflect the inherent time delay/phase shift due to the non-integer multiple relationship between the reference frequency $f_{REF}$ and the desired output frequency of the RF output signal $RF_{OUT}$. The DTC SAR control SR is used to adjust the time delay of the sampling clock SCL, such that the RF output signal $RF_{OUT}$ will iteratively align to the sampling clock SCL in phase and therefore a phase shift between the RF output signal $RF_{OUT}$ and the reference signal REF can be estimated.

In this embodiment, each estimation process of the phase sampling unit 12 still takes N clock-cycles, e.g. N=8, of the reference signal REF, and also includes the quadrant estimation (first several clock-cycles of every N clock-cycles, e.g. first four clock-cycles of every eight clock-cycles) and the SAR phase estimation (last several clock-cycles of every N clock-cycles, e.g. last four clock-cycles of the every eight clock-cycles). The quadrant estimation determines which relative quadrant the phase of the RF output signal $RF_{OUT}$ lies, while the SAR phase estimation iteratively estimates the phase of the RF output signal $RF_{OUT}$ for increasing accuracy. In different applications, N may be a different integer number and greater than 4. The value of N depends on the phase accuracy and phase setting time requirements. The quadrant estimation and the SAR phase estimation each may take fewer or more clock-cycles.

Typically, the PLL 10 operates dynamically, and will be re-settled if there is a signal jitter. In some applications, the quadrant estimation will only be performed one time for a first settlement of the PLL 10. For the following settlements of the PLL 10, the quadrant estimation may be skipped. As such, the value of N for each following settlement of the PLL 10 may be lower than 4.

In a first clock-cycle of the reference signal REF, the DTC mixing control MX is 0 and the DTC SAR control SR is 0. As such, the DTC total control TOL provided by the DTC controller 26 is 0, which leads to a 0 ps time delay. The DTC 24 is configured to receive the DTC total control TOL, and to provide the sampling clock SCL, which has the 0 ps time delay offset from the reference signal REF. Herein, the sampler 28 is configured to sub-sample the RF output signal $RF_{OUT}$ with the 0 ps-time-delay sampling clock SCL. If the RF output signal $RF_{OUT}$ aligns to the 0 ps-time-delay sampling clock SCL, the RF output signal $RF_{OUT}$ with the 0 ps-time-delay has a 0 degree phase shift from the reference signal REF. In the first clock-cycle of the reference signal REF, the sub-sampled output SUB, which is based on the 0 ps-time-delay sampling clock SCL and provided by the provided by the sampler 28, is equal to 0.

In a second clock-cycle of the reference signal REF, the DTC mixing control MX is 4 and the DTC SAR control SR is 16. As such, the DTC total control TOL provided by the DTC controller 26 is 20, which leads to a 125 ps time delay (the DTC mixing control MX leads to a 25 ps time delay and the DTC SAR control SR leads to a 100 ps time delay). The DTC 24 is configured to receive the DTC total control TOL, and to provide the sampling clock SCL, which has the 125 ps time delay offset from the reference signal REF. The sampler 28 is configured to sub-sample the RF output signal $RF_{OUT}$ with the 125 ps-time-delay sampling clock SCL. If the RF output signal $RF_{OUT}$ aligns to the 125 ps-time-delay sampling clock SCL, the RF output signal $RF_{OUT}$ with the 125 ps-time-delay has a −112.5 degree phase shift from the reference signal REF. Herein, the −112.5 degree phase shift of the RF output signal $RF_{OUT}$ includes the inherent −22.5 degree phase shift for the second clock-cycle of the reference signal REF (caused by the DTC mixing control MX). In the second clock-cycle of the reference signal REF, the sub-sampled output SUB, which is based on the 125 ps-time-delay sampling clock SCL and provided by the provided by the sampler 28, is equal to 1.

In a third clock-cycle of the reference signal REF, the DTC mixing control MX is 8 and the DTC SAR control SR is 32. As such, the DTC total control TOL provided by the DTC controller 26 is 40, which leads to a 250 ps time delay (the DTC mixing control MX leads to a 50 ps time delay and the DTC SAR control SR leads to a 200 ps time delay). The DTC 24 is configured to receive the DTC total control TOL, and to provide the sampling clock SCL, which has the 250 ps time delay offset from the reference signal REF. The sampler 28 is configured to sub-sample the RF output signal $RF_{OUT}$ with the 250 ps-time-delay sampling clock SCL. If the RF output signal $RF_{OUT}$ aligns to the 250 ps-time-delay sampling clock SCL, the RF output signal $RF_{OUT}$ with the 250 ps-time-delay has a −225 degree phase shift from the reference signal REF. Herein, the −225 degree phase shift of the RF output signal $RF_{OUT}$ includes the inherent −50 degree phase shift accumulated for the second and third clock-cycles of the reference signal REF (caused by the DTC mixing control MX). In the third clock-cycle of the reference signal REF, the sub-sampled output SUB, which is based on the 250 ps-time-delay sampling clock SCL and provided by the provided by the sampler 28, is equal to 1.

In a fourth clock-cycle of the reference signal REF, the DTC mixing control MX is 12 and the DTC SAR control SR is 48. As such, the DTC total control TOL provided by the DTC controller 26 is 60, which leads to a 375 ps time delay (the DTC mixing control MX leads to a 75 ps time delay and the DTC SAR control SR leads to a 300 ps time delay). The DTC 24 is configured to receive the DTC total control TOL, and to provide the sampling clock SCL, which has the 375 ps time delay offset from the reference signal REF. The sampler 28 is configured to sub-sample the RF output signal $RF_{OUT}$ with the 375 ps-time-delay sampling clock SCL. If the RF output signal $RF_{OUT}$ aligns to the 375 ps-time-delay sampling clock SCL, the RF output signal $RF_{OUT}$ with the 375 ps-time-delay has a −337.5 degree phase shift from the reference signal REF. Herein, the −337.5 degree phase shift of the RF output signal $RF_{OUT}$ includes the inherent −67.5 degree phase shift accumulated for the second, third, and fourth clock-cycles of the reference signal REF (caused by the DTC mixing control MX). In the fourth clock-cycle of the reference signal REF, the sub-sampled output SUB, which is based on the 375 ps-time-delay sampling clock SCL and provided by the provided by the sampler 28, is equal to 0.

The DTC mixing control MX, the DTC SAR control SR, and the DTC total control TOL, each has a monotonic relationship with the time delay of the sampling clock (compared to the reference signal), and each is updated in each clock-cycle. In the first 4 clock-cycles of the reference signal REF, the DTC mixing control MX, the DTC SAR control SR, and the DTC total control TOL each changes linearly with an equal increment for each clock-cycle of the reference signal REF. The DTC mixing control MX has an increment of 4, which leads to a 25 ps time delay for each clock-cycle of the reference signal REF. The DTC SAR control SR has an increment of 16, which leads to a 100 ps time delay for each clock-cycle of the reference signal REF. The DTC total control TOL has an increment of 20, which leads to a 125 ps time delay for each clock-cycle of the reference signal REF.

In the first four clock-cycles of the reference signal REF, the DTC mixing control MX is designed so as to reflect the inherent time delay (with the 25 ps time increment for every clock-cycle of the reference signal REF) of the RF output signal $RF_{OUT}$ (corresponding to the inherent phase shift with the −22.5 degree increment for each clock-cycle of the reference signal REF). The DTC SAR control SR is designed such that the time delays of the sampling clock SCL (offset from the reference signal REF) caused by the DTC SAR control SR for the first, second, third, and fourth clock-cycles of the reference signal REF are equally spread-out in one clock-cycle of the RF output signal $RF_{OUT}$ (0 ps, 100 ps, 200 ps, 300 ps for one 400 ps clock-cycle of the RF output signal $RF_{OUT}$). Consequently, the sampler 28 is enabled to sub-sample the RF output signal $RF_{OUT}$ at each quarter of one clock-cycle of the RF output signal $RF_{OUT}$ with a corresponding inherent time delay. In this example, the sub-sampled outputs SUB provided by the sampler 28 for the first, second, third, and fourth clock-cycles of the reference signal REF are 0, 1, 1, and 0, respectively, which indicates that the phase of the RF output signal $RF_{OUT}$ lies in a phase range that is equivalent to a first quadrant with a corresponding inherent phase shift.

The quadrant estimation is necessary for the RF output signal $RF_{OUT}$ without a 50% duty cycle waveform. With this quadrant estimation, the RF output signal $RF_{OUT}$ may have a duty cycle between 25% and 75%. Once the phase of the RF output signal $RF_{OUT}$ is detected in the first quadrant with the corresponding inherent phase shift, the SAR phase estimation starts to further adjust the time delay of the sampling clock SCL, such that the RF output signal $RF_{OUT}$ will iteratively align to the sampling clock SCL in phase. Consequently, a phase shift between the RF output signal $RF_{OUT}$ and the reference signal REF can be estimated.

In a fifth clock-cycle of the reference signal REF, the DTC mixing control MX is still designed to reflect the inherent time delay of the RF output signal $RF_{OUT}$, and the DTC SAR control SR is designed such that the time delay of the sampling clock SCL (offset from the reference signal REF) caused by the DTC SAR control SR lies in the first quarter of one clock-cycle of the RF output signal $RF_{OUT}$ (which corresponds to the first quadrant in phase). In one example, the DTC mixing control MX is 16, and the DTC SAR control SR is 8. The DTC controller 26 is configured to provide the DTC total control TOL=24, which leads to a 150 ps time delay offset from the reference signal REF (the DTC mixing control MX leads to a 100 ps time delay and the DTC SAR control SR leads to a 50 ps time delay). The DTC 24 is configured to receive the DTC total control TOL, and to provide the sampling clock SCL, which has the 150 ps time delay from the reference signal REF. Besides the inherent time delay 100 ps, the time delay of the sampling clock SCL caused by the DTC SAR control SR is 50 ps and lies in the first quarter <0 ps, 100 ps> of one clock-cycle of the RF output signal $RF_{OUT}$.

The sampler 28 is configured to sub-sample the RF output signal $RF_{OUT}$ with the 150 ps-time-delay sampling clock SCL and to provide the sub-sampled output SUB. If the RF output signal $RF_{OUT}$ aligns to the 150 ps-time-delay sampling clock SCL, the RF output signal $RF_{OUT}$ with the 150 ps-time-delay has a −135 degree phase shift from the reference signal REF. Herein, the −135 degree phase shift of the RF output signal $RF_{OUT}$ includes the inherent −90 degree phase shift caused by the DTC mixing control MX (accumulated for the second-fifth clock-cycles of the reference signal REF) and −45 degree phase shift caused by the DTC SAR control SR (within the first quadrant). The sampled output SUB based on the 150 ps-time-delay sampling clock SCL is equal to 0, which indicates that the sampling clock SCL leads the RF output signal $RF_{OUT}$ in phase. In current clock-cycle of the reference signal REF, the phase of the RF output signal $RF_{OUT}$ lies between −135 degrees and −180 degrees (between −45 degrees and −90 degrees with a −90 degree inherent phase shift).

In a sixth clock-cycle of the reference signal REF, the DTC mixing control MX is designed to reflect the inherent time delay of the RF output signal $RF_{OUT}$, and the DTC SAR control SR is designed such that the time delay of the sampling clock SCL (offset from the reference signal REF) caused by the DTC SAR control SR lies between −45 degrees and −90 degrees. In one example, the DTC mixing control MX is 20, and the DTC SAR control SR is 12. The DTC controller 26 is configured to provide the DTC total control TOL=32, which leads to a 200 ps time delay offset from the reference signal REF (the DTC mixing control MX leads to a 125 ps time delay and the DTC SAR control SR leads to a 75 ps time delay). The DTC 24 is configured to receive the DTC total control TOL, and to provide the sampling clock SCL, which has the 200 ps time delay from the reference signal REF.

The sampler 28 is configured to sub-sample the RF output signal $RF_{OUT}$ with the 200 ps-time-delay sampling clock SCL and to provide the sub-sampled output SUB. If the RF output signal $RF_{OUT}$ aligns to the 200 ps-time-delay sampling clock SCL, the RF output signal $RF_{OUT}$ with the 200 ps-time-delay has a −180 degree phase shift from the reference signal REF. Herein, the −180 degree phase shift of the RF output signal $RF_{OUT}$ includes the inherent −112.5 degree phase shift caused by the DTC mixing control MX (accumulated for the second-sixth clock-cycles of the reference signal REF) and −67.5 degree phase shift caused by the DTC SAR control SR (within the phase shift range between −45 degrees and −90 degrees). The sampled output SUB based on the 200 ps-time-delay sampling clock SCL is equal to 1, which indicates that the RF output signal $RF_{OUT}$ leads the sampling clock SCL in phase. In the current clock-cycle of the reference signal REF, the phase of the RF output signal $RF_{OUT}$ lies between −157.5 degrees and −180 degrees (between −45 degrees and −67.5 degrees with a −112.5 degree inherent phase shift).

In a seventh clock-cycle of the reference signal REF, the DTC mixing control MX is designed to reflect the inherent time delay of the RF output signal $RF_{OUT}$, and the DTC SAR control SR is designed such that the time delay of the sampling clock SCL (offset from the reference signal REF) caused by the DTC SAR control SR lies between −45 degrees and −67.5 degrees. In one example, the DTC mixing control MX is 24, and the DTC SAR control SR is 10. The DTC controller 26 is configured to provide the DTC total control TOL=34, which leads to a 212.5 ps time delay offset from the reference signal REF (the DTC mixing control MX leads to a 150 ps time delay and the DTC SAR control SR leads to a 62.5 ps time delay). The DTC 24 is configured to receive the DTC total control TOL, and to provide the sampling clock SCL, which has the 212.5 ps time delay from the reference signal REF The sampler 28 is configured to sub-sample the RF output signal $RF_{OUT}$ with the 212.5 ps-time-delay sampling clock SCL and to provide the sub-sampled output SUB. If the RF output signal $RF_{OUT}$ aligns to the 212.5 ps-time-delay sampling clock SCL, the RF output signal $RF_{OUT}$ with the 212.5 ps-time-delay has a −191.3 degree phase shift from the reference signal REF. Herein, the −191.3 degree phase shift of the RF output signal $RF_{OUT}$ includes the inherent −135 degree phase shift caused by the DTC mixing control MX (accumulated for the second-seventh clock-cycles of the reference signal REF) and −56.3 degree phase shift caused by the DTC SAR control SR (within the phase shift range between −45 degrees and −67.5 degrees). The sampled output SUB based on the 212.5 ps-time-delay sampling clock SCL is equal to 0, which indicates that the sampling clock SCL leads the RF output signal $RF_{OUT}$ in phase. In current clock-cycle of the reference signal REF, the phase of the RF output signal $RF_{OUT}$ lies between −191.3 degrees and −202.5 degrees (between 56.3 degrees and −67.5 degrees with a −135 degree inherent phase shift).

In an eighth clock-cycle of the reference signal REF, the DTC mixing control MX is designed to reflect the inherent time delay of the RF output signal $RF_{OUT}$, and the DTC SAR control SR is designed such that the time delay of the sampling clock SCL (offset from the reference signal REF) caused by the DTC SAR control SR lies between −56.3 degrees and −67.5 degrees. In one example, the DTC mixing control MX is 28, and the DTC SAR control SR is 11. The DTC controller 26 is configured to provide the DTC total control TOL=39, which leads to a 243.8 ps time delay offset from the reference signal REF (the DTC mixing control MX leads to a 175 ps time delay and the DTC SAR control SR leads to a 68.8 ps time delay). The DTC 24 is configured to receive the DTC total control TOL, and to provide the sampling clock SCL, which has the 243.8 ps time delay from the reference signal REF.

The sampler 28 is configured to sub-sample the RF output signal $RF_{OUT}$ with the 243.8 ps-time-delay sampling clock SCL and to provide the sub-sampled output SUB. If the RF output signal $RF_{OUT}$ aligns to the 243.8 ps-time-delay sampling clock SCL, the RF output signal $RF_{OUT}$ with the 243.8 ps-time-delay has a −219.4 degree phase shift from the reference signal REF. Herein, the −219.4 degree phase shift of the RF output signal $RF_{OUT}$ includes the inherent −157.5 degree phase shift caused by the DTC mixing control MX (accumulated for the second-eighth clock-cycles of the reference signal REF) and a −61.9 degree phase shift caused by the DTC SAR control SR (within the phase shift range between −56.3 degrees and −67.5 degrees). The sampled output SUB based on the 243.8 ps-time-delay sampling clock SCL is equal to 1, which indicates that the RF output signal $RF_{OUT}$ leads/aligns the sampling clock SCL in phase. In the current clock-cycle of the reference signal REF, the phase of the RF output signal $RF_{OUT}$ lies between −213.8 degrees and −219.4 degrees (between −56.3 degrees and −61.9 degrees with a −157.5 degree inherent phase shift).

After eight clock-cycles of the reference signal REF, the SAR phase estimator 14 is configured to generate the phase word PH, which indicates the phase estimation of the RF output signal $RF_{OUT}$ compared to the reference signal REF (−219.4 degrees in this case). The phase word PH is generated based on the sub-sampled outputs SUB in the first through eighth clock-cycles of the reference signal REF. A different combination of the sub-sampled outputs SUB in the first through eighth clock-cycles of the reference signal REF will lead to a different phase word PH. The SAR phase estimator 14 is configured to generate one phase word PH every N (e.g. N=8 in this case) clock-cycles of the reference signal REF.

In the last four clock-cycles of the reference signal REF, the DTC mixing control MX still changes linearly with the equal increment of 4 for each clock-cycle of the reference signal REF. The DTC mixing control MX is designed so as to reflect the inherent time delay (with the 25 ps time increment for every clock-cycle of the reference signal REF) of the RF output signal $RF_{OUT}$ (corresponding to the inherent phase shift with the −22.5 degree increment for each clock-cycle of the reference signal REF).

Different from in the first 4 clock-cycles of the reference signal REF, in the last 4 clock-cycles of the reference signal REF, the DTC SAR control SR changes non-linearly. The non-linear updates of the DTC SAR control SR lead to increments or decrements in the time delay of the sampling clock (compared to the reference signal REF), and correspondingly lead to increments or decrements in the phase shift between the RF output signal $RF_{OUT}$ and the reference signal. In the first four clock-cycles of the reference signal REF, the DTC SAR control SR is determined not to be related to the sub-sampled output SUB, while in the last four clock-cycles of the reference signal REF, the DTC SAR control SR is determined based on the sub-sampled output SUB generated in the corresponding previous clock-cycle of the reference signal REF.

Those skilled in the art will recognize improvements and modifications to the preferred embodiments of the present disclosure. All such improvements and modifications are considered within the scope of the concepts disclosed herein and the claims that follow.

What is claimed is:

1. A phase-locked-loop (PLL) comprising:
   a local oscillator (LO) configured to generate a radio frequency (RF) output signal;
   a phase sampling unit, which is configured to receive a reference signal and the RF output signal, and to generate a sub-sampled output by sub-sampling the RF output signal with a sampling clock, wherein,
   the sampling clock has a same frequency as the reference signal and is offset by a time delay from the reference signal; and
   the time delay of the sampling clock offset from the reference signal is updated in each clock-cycle of the reference signal; and
   a successive-approximation-register (SAR) phase estimator configured to generate a phase word every N clock-cycles of the reference signal, wherein,
   N is a positive integer number;
   the phase word is derived from the sub-sampled output generated in each clock-cycle of the every N clock-cycles of the reference signal, and indicates a phase shift of the RF output signal compared to the reference signal; and
   the LO is configured to update the RF output signal based on the phase word.

2. The PLL of claim 1 wherein the phase sampling unit comprises:
   a digital to time convertor (DTC) controller configured to provide a DTC total control, wherein,
   the DTC total control is updated in each clock-cycle of the reference signal; and
   in at least some clock-cycles of the every N clock-cycles of the reference signal, the DTC total control is updated based on the sub-sampled output generated in a corresponding previous clock-cycle of the reference signal;
   a DTC configured to receive the reference signal and the DTC total control and to provide the sampling clock, wherein the DTC total control determines the time delay of the sampling clock offset from the reference signal in each clock-cycle of the reference signal; and
   a sampler configured to sub-sample the RF output signal with the sampling clock so as to provide the sub-sampled output in each clock-cycle of the reference signal.

3. The PLL of claim 2 wherein
   the DTC total control is updated non-linearly in the at least some clock-cycles of the every N clock-cycles of the reference signal; and
   each non-linear update of the DTC total control leads to an increment or a decrement in the time delay of the sampling clock offset from the reference signal for each clock-cycle of the reference signal.

4. The PLL of claim 2 wherein in some other clock-cycles of the every N clock-cycles of the reference signal, the DTC total control is updated linearly and is not based on any sub-sampled output.

5. The PLL of claim 2 wherein the sampler is a one-bit sampler.

6. The PLL of claim 2 wherein the DTC total control comprises a DTC mixing control and a DTC SAR control, such that the time delay of the sampling clock offset from the reference signal in each clock-cycle of the reference signal is determined by the DTC mixing control and the DTC SAR control, wherein
   the DTC mixing control signal is updated not based on the sub-sampled output; and
   in the at least some clock-cycles of the every N clock-cycles of the reference signal, the DTC SAR control is updated based on the sub-sampled output generated in the corresponding previous clock-cycle of the reference signal.

7. The PLL of claim 6 wherein,
   in first M clock-cycles of the every N clock-cycles of the reference signal, the DTC SAR control is updated linearly with an equal increment in each clock-cycle of the first M clock-cycles of the reference signal, wherein the equal increment in the DTC SAR control leads to an equal increment in the time delay of the sampling clock offset from the reference signal in each clock-cycle of the first M clock-cycles of the reference signal, wherein M is a positive integer and less than N; and
   in remaining clock-cycles of the every N clock-cycles of the reference signal, the DTC SAR control is updated non-linearly in each clock-cycle of the remaining clock-cycles of the reference signal, wherein,
   each non-linear update of the DTC SAR control is based on the sub-sampled output generated in the corresponding previous clock-cycle of the reference signal; and
   each non-linear update of the DTC SAR control leads to an increment or a decrement in the time delay of the sampling clock offset from the reference signal for each clock-cycle of the remaining clock-cycles of the reference signal.

8. The PLL of claim 6 wherein the DTC mixing control is updated linearly with an equal increment in each clock-cycle of the every N clock-cycles of the reference signal, wherein the equal increment in the DTC mixing control leads to an equal increment in the time delay of the sampling clock offset from the reference signal for each clock-cycle of the reference signal.

9. The PLL of claim 8 wherein,
   in first M clock-cycles of the every N clock-cycles of the reference signal, the DTC SAR control is updated linearly with an equal increment in each clock-cycle of the first M clock-cycles of the reference signal, wherein the equal increment in the DTC SAR control leads to an equal increment in the time delay of the sampling clock offset from the reference signal in each clock-cycle of the first M clock-cycles of the reference signal, wherein M is a positive integer and less than N; and
   the equal increment in the DTC SAR control and the equal increment in the DTC mixing control are different; and
   in remaining clock-cycles of the every N clock-cycles of the reference signal, the DTC SAR control is updated non-linearly in each clock-cycle of the remaining clock-cycles of the reference signal, wherein,
   each non-linear update of the DTC SAR control is based on the sub-sampled output generated in the corresponding previous clock-cycle of the reference signal; and each non-linear update of the DTC SAR control leads to an increment or a decrement in the time delay of the sampling clock offset from the reference signal for each clock-cycle of the remaining clock-cycles of the reference signal.

10. The PLL of claim 2 wherein the DTC total control comprises a DTC mixing control and a DTC SAR control, such that the time delay of the sampling clock offset from the reference signal in each clock-cycle of the reference signal is determined by the DTC mixing control and the DTC SAR control, wherein
   the DTC mixing control signal remains unchanged in each clock-cycle of the every N clock-cycles of the reference signal; and
   in the at least some clock-cycles of the every N clock-cycles of the reference signal, the DTC SAR control is updated based on the sub-sampled output generated in the corresponding previous clock-cycle of the reference signal.

11. The PLL of claim 2 wherein,
   N is 8;
   in first 4 clock-cycles of the every 8 clock-cycles of the reference signal, the DTC total control is updated linearly with an equal increment in each clock-cycle of the first 4 clock-cycles of the reference signal, wherein the equal increment in the DTC total control leads to an equal increment in the time delay of the sampling clock offset from the reference signal in each clock-cycle of the first 4 clock-cycles of the reference signal; and
   in remaining 4 clock-cycles of the every 8 clock-cycles of the reference signal, the DTC total control is updated non-linearly in each clock-cycle of the remaining 4 clock-cycles of the reference signal, wherein,
      each non-linear update of the DTC total control is based on the sub-sampled output generated in the corresponding previous clock-cycle of the reference signal; and
      each non-linear update of the DTC total control leads to an increment or a decrement in the time delay of the sampling clock offset from the reference signal for each clock-cycle of the remaining 4 clock-cycles of the reference signal.

12. The PLL of claim 11 wherein a duty cycle of the RF output signal is between 25% and 75%.

13. The PLL of claim 1 wherein the LO is a digitally controlled oscillator (DCC)).

14. The PLL of claim 13 further comprising a loop filter between the SAR phase estimator and the LO, wherein the loop filter is configured to provide a digital control signal to the LO based on the phase word.

15. The PLL of claim 14 wherein the loop filter is a low-pass filter.

16. The PLL of claim 14 further comprising:
   a differentiator following the SAR phase estimator, wherein the differentiator is configured to differentiate the phase word into a frequency parameter; and
   a proportional integral (PI) control unit between the differentiator and the loop filter, wherein,
      the PI control unit is configured to receive the frequency parameter from the differentiator and provide a difference output signal to the loop filter; and
      the loop filter is configured to provide the digital control signal by filtering the difference output signal.

17. The PLL of claim 16 wherein both the differentiator and the PI control unit operate at a frequency as 1/N of a frequency of the reference signal.

18. The PLL of claim 13 further comprising a loop filter between the SAR phase estimator and the LO, wherein the loop filter is configured to receive the phase word from the SAR phase estimator and to provide a digital control signal to the LO.

19. The PLL of claim 1 wherein N is greater than 4.

* * * * *

UNITED STATES PATENT AND TRADEMARK OFFICE
CERTIFICATE OF CORRECTION

PATENT NO. : 11,296,710 B2
APPLICATION NO. : 17/000647
DATED : April 5, 2022
INVENTOR(S) : Anton Willem Roodnat It is certified that error appears in the above-identified patent and that said Letters Patent is hereby corrected as shown below:

In the Claims
Claim 13, Column 20, Line 9, replace "(DCC))" with --(DCO)--.

Signed and Sealed this
Seventeenth Day of May, 2022

*Katherine Kelly Vidal*
Katherine Kelly Vidal
*Director of the United States Patent and Trademark Office*